(12) United States Patent
Vervaeke

(10) Patent No.: US 9,797,964 B2
(45) Date of Patent: *Oct. 24, 2017

(54) DEVICES AND METHODS FOR DETERMINING A MAGNETIC FIELD DISTRIBUTION OF A MAGNET ALONG A MAIN SURFACE OF SAID MAGNET

(71) Applicant: MAGCAM NV, Heverlee (BE)

(72) Inventor: Koen Vervaeke, Linden (BE)

(73) Assignee: MAGCAM NV, Heverlee (BE)

( * ) Notice: Subject to any disclaimer, the term of this patent is extended or adjusted under 35 U.S.C. 154(b) by 270 days.

This patent is subject to a terminal disclaimer.

(21) Appl. No.: 14/435,208

(22) PCT Filed: Oct. 4, 2013

(86) PCT No.: PCT/EP2013/070712
§ 371 (c)(1),
(2) Date: Apr. 13, 2015

(87) PCT Pub. No.: WO2014/060224
PCT Pub. Date: Apr. 24, 2014

(65) Prior Publication Data
US 2015/0276895 A1    Oct. 1, 2015

(30) Foreign Application Priority Data
Oct. 15, 2012 (EP) ..................... 12188521

(51) Int. Cl.
*G01R 33/10*    (2006.01)
*G01R 33/00*    (2006.01)

(52) U.S. Cl.
CPC ......... *G01R 33/10* (2013.01); *G01R 33/0094* (2013.01)

(58) Field of Classification Search
CPC ........ A61B 18/082; A61B 2018/00345; A61B 2018/00404; A61B 2018/00619;
(Continued)

(56) References Cited

U.S. PATENT DOCUMENTS 4,466,725 A * 8/1984 Hirohata .................. G02B 7/08
                                                                    396/132
5,733,405 A * 3/1998 Taki .................. H01J 37/32623
                                                                    118/723 E
(Continued)

FOREIGN PATENT DOCUMENTS

CN    1963555    5/2007
CN    202393897    8/2012
(Continued)

OTHER PUBLICATIONS

Zhang et al, Wireless Magnetic Sensor Node for Vehicle Detection Using Finite Element Simulation, 2013.*
(Continued)

*Primary Examiner* — Shan Elahi
(74) *Attorney, Agent, or Firm* — McDonnell Boehnen Hulbert & Berghoff LLP

(57) ABSTRACT

Embodiments described herein relate to devices and methods for determining a magnetic field distribution of a magnet along a main surface of said magnet. An example device for determining a magnetic field distribution of a magnet along a main surface of said magnet includes an arrangement of at least two independent magnetic field camera modules being arranged in a fixed relative position with respect to each other, each magnetic field camera module being adapted for measuring a magnetic field distribution to which it is exposed by means of a respective detection surface. The device also includes a means for providing a predetermined relative movement between the main surface and the
(Continued)

arrangement to thereby scan the magnetic field distribution of the magnet along the main surface.

20 Claims, 7 Drawing Sheets

(58) Field of Classification Search
CPC ........... A61B 2018/00928; A61B 2018/00946; H01H 15/10; H01H 2215/00; H01H 2221/014; H01H 2239/078; H01H 2300/014; H01H 3/50; G01R 33/0094; G01R 33/10
USPC .......................................................... 348/150
See application file for complete search history.

(56) References Cited

U.S. PATENT DOCUMENTS

| | | | | |
|---|---|---|---|---|
| 6,023,165 | A * | 2/2000 | Damadian | A61B 5/055 324/318 |
| 2002/0043975 | A1* | 4/2002 | Aoki | G01R 33/3873 324/309 |
| 2002/0158657 | A1* | 10/2002 | Takagi | H02K 15/03 324/765.01 |
| 2002/0187501 | A1* | 12/2002 | Huang | C07H 21/00 435/5 |
| 2003/0184181 | A1* | 10/2003 | Ohnishi | H02K 29/03 310/254.1 |
| 2004/0218249 | A1* | 11/2004 | Kochergin | G02F 1/09 359/280 |
| 2007/0046287 | A1 | 3/2007 | Vervaeke et al. | |
| 2007/0170917 | A1* | 7/2007 | Thompson | G01R 33/243 324/307 |
| 2009/0128135 | A1* | 5/2009 | Masham | G01R 33/10 324/205 |
| 2010/0285606 | A1* | 11/2010 | Phillips | B01L 3/502761 436/501 |
| 2011/0260748 | A1* | 10/2011 | Lee | G01R 31/343 324/765.01 |
| 2012/0068653 | A1* | 3/2012 | Takahashi | H02P 21/141 318/490 |
| 2012/0209546 | A1* | 8/2012 | Vervaeke | G01R 33/0064 702/57 |
| 2013/0335551 | A1* | 12/2013 | Mandier | G21C 17/003 348/84 |
| 2014/0292329 | A1* | 10/2014 | Brunner | G01R 33/287 324/309 |
| 2016/0274060 | A1* | 9/2016 | Denenberg | G01N 27/9046 |

FOREIGN PATENT DOCUMENTS

| | | |
|---|---|---|
| DE | 10 2009 049639 A1 | 4/2011 |
| JP | 04-310885 | 2/1992 |
| JP | 2000258397 | 9/2000 |
| JP | 2001330592 | 11/2001 |
| JP | 2007057281 | 3/2007 |
| JP | 2008151744 | 7/2008 |
| JP | 2011075439 | 4/2011 |
| JP | 2012185155 | 9/2012 |

OTHER PUBLICATIONS

Vervaeke et al, Automated magnetic inspection of peranent magnet rotors, 2013.*
PCT International Search Report, PCT International Application No. PCT/EP2013/070712, dated Dec. 10, 2013.
"Design of Magnetic Field Distribution Measurement System"; Ya-xue Xu, et al.; Chinese Journal of Electron Devices, vol. 32, No. 2, pp. 382-385; Apr. 2009 (Machine Translation and original with English Abstract).

* cited by examiner

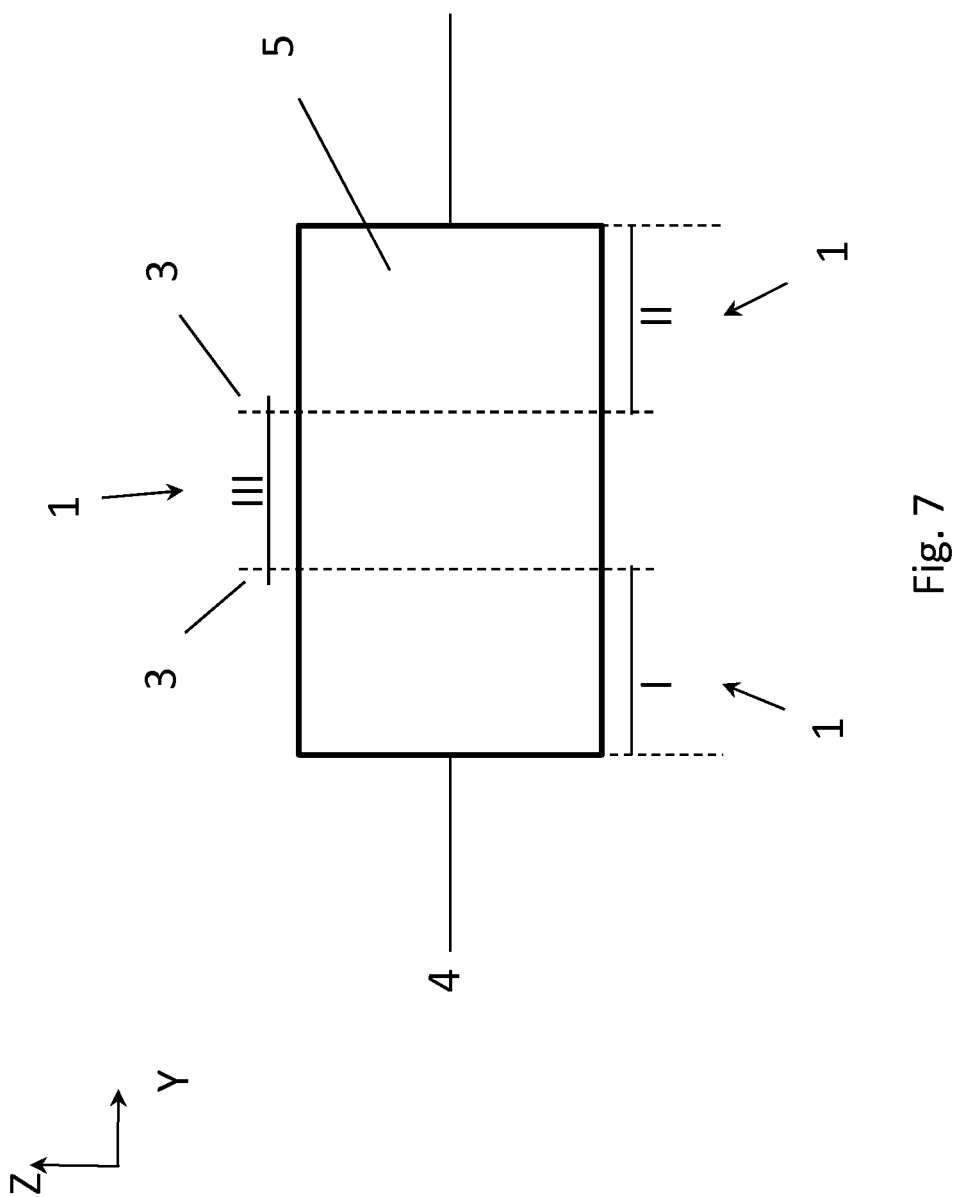

DEVICES AND METHODS FOR DETERMINING A MAGNETIC FIELD DISTRIBUTION OF A MAGNET ALONG A MAIN SURFACE OF SAID MAGNET

CROSS-REFERENCE TO RELATED APPLICATION

This application is a U.S. national phase application of International Patent Application No. PCT/EP2013/070712 filed on Oct. 4, 2013, which claims the benefit of European patent application 12188521.4, filed Oct. 15, 2012.

TECHNICAL FIELD

The present disclosure relates to devices and methods for determining a magnetic field distribution of a magnet.

BACKGROUND ART

Fast and accurate quality inspection of permanent magnets is increasingly important in development and production of electric drives. Parameters such as cogging torque, efficiency and power are directly influenced by the quality of permanent magnets in an electric drive. Moreover, recent price increases of rare earth materials force e-drive developers and manufacturers to use these precious materials in an efficient way, minimizing the amount of wasted magnet material, in other words, get the most performance out of the least amount of magnet material, meaning each magnet needs to conform to strict quality demands.

In order to accurately determine the full magnet quality, different magnet parameters need to be measured in an economic way, such as the remanence magnetization vector and its angular deviation, magnet homogeneity, material defect presence, magnetization deviations etc. With the increasing use of electric drives in automotive applications, an economic magnet inspection solution is needed, that is not only capable of measuring all these critical magnet characteristics, but also is compatible with automated production of electric drives. This means that the inspection solution must be fast, give quantitative results for all of the above mentioned magnet properties and be easily implementable in production lines. Classical magnetic measurement techniques fail to simultaneously deliver on all of the above mentioned requirements, either because they are too slow, only measure a single magnet property, are not digital etc.

A magnetic measurement system is known, also referred to as a magnetic field camera, which is an advanced magnet inspection technology for all kinds of permanent magnets, including uniaxial and multi pole magnets in various applications. The magnetic field camera technology is based on mapping the magnetic field distribution of a magnet using a plurality of magnetic field sensors.

In European patent application EP1720026, an example of such a magnetic field camera, also called a magnetic camera module, is described.

In European patent application EP2508906, an arrangement is described for characterizing magnetic systems based on an initialized set of input parameters of the magnetic system, the arrangement comprising:
  means for measuring the magnetic field distribution, typically embodied as a magnetic camera module, and
  means for determining an optimal expected magnetic field distribution of the magnetic system.

In practice however, there exists an industrial need for improved devices and methods for characterising magnetic systems in an automatic way, especially magnetic systems comprising relatively large surfaces, which can be typically larger than the size of existing magnetic camera modules.

SUMMARY OF THE DISCLOSURE

It is an aim of the present disclosure to provide a device for determining a magnetic field distribution of a magnet along a main surface of the magnet.

This aim is achieved according to the disclosure with the device showing the technical characteristics of the first independent claim.

It is another aim of the present disclosure to provide a method for determining a magnetic field distribution of a magnet along a main surface of the magnet.

This aim is achieved according to the disclosure with a method comprising the steps of the second independent claim.

In a first aspect of the present invention, a device is disclosed for determining a magnetic field distribution of a magnet along a main surface of the magnet, the device comprising:
  a. an arrangement of at least two, or a plurality of, independent magnetic field camera modules being arranged in a fixed relative position with respect to each other, each magnetic field camera module being adapted for measuring a magnetic field distribution to which it is exposed by means of a respective detection surface;
  b. a means for providing a, preferably predetermined, relative movement between the main surface and the arrangement to thereby scan the magnetic field distribution of the magnet along the main surface; for instance along the complete main surface.

It is an advantage of embodiments of the present invention that a magnetic field distribution of a magnet, for instance of a complete main surface thereof, can be determined in a quick and/or automated way.

It is a further advantage of embodiments of the present invention that the magnetic field distribution can efficiently be determined for a main surface of a magnet which is larger or substantially larger than the detection surface of a single magnetic camera.

A magnetic field camera or camera module can be a device which comprises a plurality of sensors, for instance arranged in a matrix or line configuration, each sensor capable of measuring properties of a magnetic field, and which is capable of measuring a magnetic field distribution. A magnetic field camera can for instance be a camera as disclosed in EP1720026 or EP2508906, which are hereby incorporated by reference. It can for instance be a 2-dimensional (2D) Hall sensor array.

The means for providing the predetermined relative movement can be any suitable means or apparatus known to the skilled person.

Scanning the magnetic field distribution of the magnet along the main surface of the magnet can comprise measuring the magnetic field distribution along said main surface. According to preferred embodiments, scanning can be a continuous process, wherein measurements and relative movements are occurring contemporaneously. According to other preferred embodiments, scanning can be a discontinuous process, wherein movement and measurement are applied sequentially.

According to preferred embodiments, the magnetic field camera modules can comprise a matrix of individual sensor elements which constitute their detection surface. According to certain embodiments, all of these elements can be involved in the scanning process. According to other embodiments, not all of these elements are involved or need to be involved. For instance, depending on the relative movement applied, it may be sufficient to only use a single row or column of a camera module, for one or more of the camera modules used or present. This may increase speed of the scanning process.

According to preferred embodiments, the magnetic field camera modules are identical. The magnetic field camera modules may comprise an upper surface comprising the detection surface, and which further extends beyond the detection surface, defining a dead zone for the camera module in which measurements of the applied magnetic field cannot be taken. The camera modules can be essentially cubic in shape, but can have any other shape. The upper surface can be essentially square, but can have any other shape. In case the upper surface defines the lateral dimensions of the sidewalls of the camera module, the upper surfaces are preferably such that they can be stacked in a closed configuration, i.e. without leaving space in between two adjacent camera modules. The detection surface of a camera module can be square or rectangular, but can have any shape. The detection surface can for instance be centered or positioned symmetrically on the upper surface of the camera module. The camera module may further comprise internal electronics, and may be connected wired or wirelessly to an external control apparatus of means.

According to preferred embodiments, the means for providing the relative movement may further comprise a controller for steering the movement.

According to preferred embodiments of a first general type, all of the at least two independent magnetic field camera modules are arranged such that their detection surfaces are lying within a single plane.

According to preferred embodiments, the respective detection surfaces are arranged and aligned along a single line. This can be advantageous when the relative movement embodies a scanning process of the line scanning type.

According to preferred embodiments, the respective detection surfaces are arranged and aligned along two parallel lines, such that the orthogonal projection of their respective detection surfaces on a virtual line parallel to the two parallel lines provides a single uninterrupted portion of the virtual line. This can be advantageous when the relative movement embodies a scanning process of the line scanning type. This can for instance correspond to a 1.5D scan embodiment as described in the detailed description.

According to preferred embodiments, the means for providing a predetermined relative movement is adapted for providing one or more relative translational movements between the arrangement and the main surface of the magnet, whereby the detection surfaces and the main surface are maintained parallel during the movement.

According to preferred embodiments, at least one relative parallel translational movement between the arrangement and the main surface of the magnet is adapted for bridging a previously existing dead area, i.e. an area which has previously not been scanned yet by any of the camera modules, because of for instance a dead zone between at least two predetermined detection surfaces.

According to preferred embodiments, the means for providing a predetermined relative movement is adapted for providing a relative rotational movement between the arrangement and/or the main surface around a rotation axis.

According to preferred embodiments, the means for providing a predetermined relative movement is adapted for providing at least one of
  a rotational movement of the detection surfaces lying in the single plane around a first rotation axis, wherein the single plane is lying parallel to the first rotation axis (and preferably tangential to the rotation along the first rotation axis); and
  a rotational movement of the main surface of the magnet around a second rotation axis, wherein the main surface is parallel to the second rotation axis (and preferably tangential to the rotation along the second rotation axis); whereby if the means for providing a predetermined relative movement is adapted for providing both rotational movements, the first rotation axis and the second rotation axis are the same.

According to preferred embodiments of a second general type, a first subset of the at least two independent magnetic field camera modules is arranged such that their detection surfaces are laying within a first plane, and wherein a disjoint second subset of the at least two independent magnetic field camera modules is arranged such that their detection surfaces are laying within a second plane different from the first plane.

The first and second set of camera modules can be a singlet. Each of the sets can comprise for instance any of 1, 2, 3, 4, or more camera modules.

According to preferred embodiments, the respective detection surfaces of the first set are arranged and aligned along a first single line, and respective detection surfaces of the second set are arranged and aligned along a second single line, both lines being parallel.

According to preferred embodiments, the first plane and the second plane are parallel.

According to preferred embodiments, the detection surfaces of the first subset and the second subset are not facing each other. For instance, the device can comprise a linear arrangement of camera modules in a close-far-close-far-close-far setup, wherein the "close" indexed camera modules constitute the first subset and the "far" indexed camera modules constitute the second subset. Such a setup provides the advantage that depth info, and thus generally 3-dimensional info can be derived about the magnetic field.

According to preferred embodiments, the detection surfaces of the first subset and the second subset are parallel and are facing each other. This can provide the same advantage as do the embodiments in the previous paragraph, for instance when the detection surfaces of the first set and of the second set are arranged at different distances from said magnet when measuring or scanning the main surface of the magnet. Moreover, it may provide advantages in processing measurement data and/or construction of the device.

According to preferred embodiments, the first plane and the second plane are forming an angle different from 0° or 180°.

This provides the advantage that the dead areas left by a scan of the main surface of the magnet with the first set of camera modules, due to for instance the dead zones and specific arrangement (for instance interdistance) of camera modules of the first set, can be scanned easily by the arrangement of the second set of camera modules. As the camera modules of the second set and of the first set are out of plane, a larger degree of design freedom of the device/system is achieved.

According to preferred embodiments, the orthogonal projection of the respective detection surfaces of the first subset and of the second subset on a virtual line parallel to the first and the second single lines covers a single uninterrupted portion of the virtual line. This provided the advantage that the first set and second set of camera modules can scan a continuous surface of the main surface, for instance the complete main surface. Note that can of course be typically the case when each of the projections of the first and second subset themselves are not providing this feature due to dead zones between adjacent camera modules in the first and second set of modules.

According to preferred embodiments, the orthogonal projections of the detection surfaces of the magnetic camera modules of the first subset and orthogonal projections of the detection surfaces of the second subset, on a virtual line parallel to the first and the second single lines, are substantially offset with respect to each other. They preferably show a partial overlap, and may show no overlap in the theoretical limit case. The respective projections of the detection surfaces of the camera modules can for instance be following up each other alternatingly when moving in a direction along the virtual line.

According to preferred embodiments, the means for providing a predetermined relative movement is adapted for providing a relative rotational movement between the arrangement and/or the main surface around a rotation axis.

According to preferred embodiments, the means for providing a predetermined relative movement is adapted for providing at least one of
  a rotational movement of the arrangement around a first rotation axis, wherein the first plane and the second plane are lying parallel to the first rotation axis (and are preferably lying tangential to the rotation along the first rotation axis); and
  a rotational movement of the main surface of the magnet around a second rotation axis, wherein the main surface is lying parallel to the second rotation axis (and are preferably lying tangential to the rotation along the second rotation axis); whereby if the means for providing a predetermined relative movement is adapted for providing both rotational movements, the first rotation axis and the second rotation axis are the same.

According to preferred embodiments, the rotation means or apparatus comprises a rotor of an electromagnetic engine.

According to preferred embodiments, the first plane and the second plane are arranged such that in use, i.e. when performing the predetermined relative movement between the main surface and the arrangement, at least a portion of the main surface is scanned by a camera module of the first set and by a camera module of the second set at different distances from the main surface.

According to preferred embodiments, of both of the first and second general type, the predetermined movement is such that every portion of the main surface is scanned by at least one, or by at least two camera modules. This provides the advantage that measurement errors can be corrected and that adjacent measurements can be efficiently stitched together.

According to a second aspect of the present invention, a method for determining a magnetic field distribution of a magnet along a main surface of the magnet is disclosed, the method comprising:
  providing the magnet;
  providing an arrangement of at least two independent magnetic field camera modules being arranged in a fixed relative position with respect to each other, each magnetic field camera module being adapted for measuring a magnetic field distribution to which it is exposed by means of a respective detection surface;
  providing a predetermined relative movement between the main surface and the arrangement to thereby scan the magnetic field distribution of the magnet along the main surface.

According to preferred embodiment, providing a predetermined relative movement comprises providing one or more relative translational movements between the arrangement and the main surface of the magnet, whereby the detection surfaces and the main surface are maintained parallel during the movement.

According to preferred embodiment, at least one relative parallel translational movement between the arrangement and the main surface of said magnet is adapted for bridging a previously existing dead zone between at least two predetermined detection surfaces.

According to preferred embodiment, providing a predetermined relative movement comprises providing a relative rotational movement between said arrangement and/or said main surface around a rotation axis.

It will be recognized by the skilled person that features and advantages explained for the first aspect are also applicable for the second aspect, mutatis mutandis, and vice versa.

According to a third aspect of the present invention, the use of a device and/or method according to any of the embodiments of the first and/or second aspect of the present invention is disclosed for inspection and/or quality control of any of the following: permanent magnets, permanent magnets with uniaxial magnetization, magnets with multipole magnetization, ferromagnetic, paramagnetic, diamagnetic, magnetostrictive and/or superconducting materials and/or materials with other forms of magnetic response, electromagnets, magnetic assemblies or for inspection and/or quality control of welds, including but not limited to spot welds, projection welds, other resistance welds, laser welds, electron beam welds, and arc welds.

According to a fourth aspect of the present invention, a device for characterizing magnetic systems based on an initialized set of input parameters of the magnetic system is disclosed, the device comprising:
  means for measuring the magnetic field distribution, comprising a device according to any of the embodiments of the first aspect of the present invention; and
  means for determining an optimal expected magnetic field distribution of the magnetic system.

According to preferred embodiments, the device further comprising means for determining the expected magnetic field distribution, including:
i) means for determining a calculated magnetic field distribution using a theoretical simulation model,
ii) means for comparing the expected magnetic field distribution to the measured magnetic field distribution value,
iii) means for using an optimization scheme to obtain the expected magnetic field distribution of the magnetic system.

According to a fifth aspect of the present invention, a method is disclosed for characterizing magnetic systems based on an initialized set of input parameters of the magnetic system, comprising the steps of:
  measuring the magnetic field distribution by means of a device according to any of the embodiments of the first aspect of the present invention and/or a method according to any of the embodiments of the second aspect of the present invention; and determining an optimal expected magnetic field distribution of the magnetic system.

According to preferred embodiments, determining the expected magnetic field distribution can comprise:
i) from the initialized value of the input parameters, determining a calculated magnetic field distribution using a theoretical simulation model,
ii) comparing the expected magnetic field distribution to the measured magnetic field distribution value,
iii) using an optimization scheme to obtain the expected magnetic field distribution of the magnetic system
iv) repeating steps i), ii) and iii) until the expected magnetic field distribution is the same as the measured magnetic field distribution value within a tolerance.

It will be appreciated that any of the arrangements, devices, and methods of the fourth and fifth aspect of the present invention can be applied or used with the improved device and method according to aspects of the present invention.

BRIEF DESCRIPTION OF THE DRAWINGS

The disclosure will be further elucidated by means of the following description and the appended figures.

FIG. 7 illustrates an example of operating the arrangement described in relation with FIG. 5, and depicts a side cross-sectional view along the Z-Y plane of FIG. 5.

DETAILED DESCRIPTION OF PREFERRED EMBODIMENTS

Figure 1:
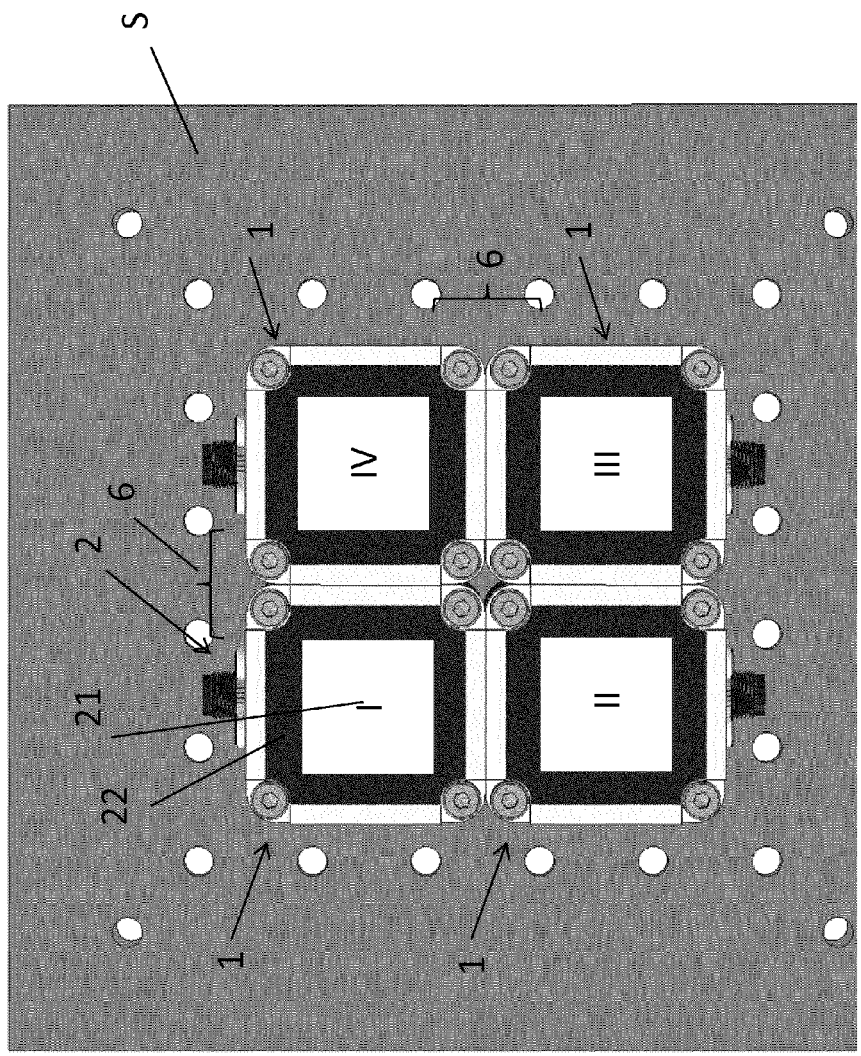
FIG. 1 shows a top view of an arrangement according to an embodiment of the present invention.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The example embodiments which are illustrated below are based on a measurement principle which is based on a high resolution and high speed quantitative 2D mapping of the magnetic field distribution of the magnet, using a sensor chip with an integrated 2D array of 128×128 (=16384) microscopic Hall sensors. The sensors have a pitch (spatial resolution) of 0.1 mm in both X and Y directions. Each Hall sensor had an active area of 40 μm×40 μm and is adapted for locally measuring the perpendicular component ($B_z$) of a magnetic field to which it is exposed. All sensors were electronically scanned at high speed, resulting in a quantitative high resolution magnetic field map over an area of 12.8 mm×12.8 mm. A full resolution magnetic field map could be captured in less than 1 second.

The magnetic field camera chip had a built-in flexibility for recording any sub matrix of the 128×128 sensor matrix. Both in X and Y directions, the start pixel, stop pixel and step size can be specified. This allows not only to e.g. operate the sensor in half resolution mode (measuring every second pixel), but also allows to e.g. measure one single pixel continuously, or record one line continuously. The latter configuration will be used later in this description to construct a large range line scan embodiment, as well as a rotor inspection embodiment.

The pixels on one sensor chip (i.e. in one magnetic field camera module) were read out in sequential order, whereby each pixel needed about 50 micro seconds measurement time. This means that one could calculate the total needed time for recording one frame by simply multiplying the total number of pixels in the frame by the time per pixel of 50 microseconds.

The measurement times for some special cases are:
Complete sensor array: t=128*128*50 μs=0.8 seconds
Half resolution, full range: t=64*64*50 μs=0.2 seconds
One line, full resolution: t=1*128*50 μs=6.4 ms
One line, half resolution: t=1*64*50 μs=3.2 ms The magnetic camera modules had a size of about 24 mm×24 mm×24 mm. The camera modules comprise an upper surface 2 comprising a detection surface 21 and a portion 22 next to this detection surface where detection is not possible. The lateral sizes of the magnetic camera module (24 mm×24 mm) were such that it was allowed to placing multiple modules next to each other, while the dead measurement zone 6 (or dead zone) in between the modules (24 mm−12.8 mm=11.2 mm) is smaller than the active measurement size of the camera itself (i.e. 12.8 mm). This principle allows filling up this dead zone 6 by moving the set of modules with one single step of 12 mm in each direction. As illustrated below, this principle makes possible a number of different module configurations that are suited to perform fast large area magnetic field mapping measurements.

The most straightforward way of covering a large are using a magnetic field camera is to mount it onto a XY(Z) scan stage (or on a robot) and to sequentially measure multiple small-scale magnetic field maps which are subsequently stitched together to obtain a large area image. The advantage of this method is that only a single magnetic field camera module would be needed.

In order to accurately stitch the different measured images into a larger image, several approaches can be taken. Either the scan step (in X and Y directions) can be taken to be exactly equal to the corresponding size of the measurement area (i.e. 12.8 mm). In this case there is no overlap between consecutive images. The quality of the resulting stitched image depends then on the accuracy of the scan stage and the alignment of the sensor X and Y axes to those of the scan stage.

Another technique, which is also found in optical image stitching, is to take the scan step somewhat smaller than the sensor size, as to assure an overlap region between adjacent images. This way, image stitching algorithms can be applied to the images, where the optimal overlap position is automatically detected. This method can correct for the lack of accuracy of the scan stage or of the alignment of the sensor to the scan stage axes.

Since the measurement speed of a magnetic field camera can be relatively high (i.e. 12.8×12.8 mm$^2$/0.8 seconds in full resolution) large areas can quickly be measured using this technique. However, for some applications, such as fast inline inspection, the speed may not be sufficient, especially for larger areas. The speed in this configuration is limited by for instance the following factors:

The measurements are performed sequentially, i.e. not in parallel

The number of mechanical steps scales with the measurement area Roughly, the total measurement time for an area A is equal to $$T_{total}=(T_{single\ measurement}+T_{scanstep})\lambda A/A_{sensor} \quad (1)$$

where $T_{total}$ is the total measurement time, $T_{single\ measurement}$ is the time needed to measure a single 12.8 mm×12.8 mm image, A is the area to be measured, $A_{sensor}$ is the area of the sensor, i.e. 12.8 mm×12.8 mm.

In the considerations below, $A_{sensor}$ has been set to 12 mm×12 mm instead of 12.8 mm×12.8 mm for the following reasons: first, usually one measures only at half resolution, meaning that the last pixel in the array will not be recorded, diminishing the effective area to 12.7 mm×12.7 mm. Second, one allows for some overlap between the different images to make it possible to use automatic stitching algorithms. In practice, a scan step of 12.0 mm has therefor been used.

Expression (1) shows that the total measurement time increases proportional to the area to be measured. Based on this formula, quantitative measurement times can be calculated for a few realistic cases.

Concerning the time per single measurement, the following approach was followed. In practice, magnetic field camera measurements are often performed with half spatial resolution (i.e. 0.2 mm) instead of full resolution (i.e. 0.1 mm), especially for larger magnets. This means that only each second pixel is measured in X- and Y-directions, resulting in only ¼ of all pixels being effectively read-out. This also means that the measurement time per frame is four times smaller, i.e. about 0.2 s/frame. On the other hand, multiple frames are usually recorded and averaged in order to reduce measurement noise. A realistic number of averages would be 5, resulting in a total measurement time per frame of 1 second, which is comparable with the time for a single frame at full resolution.

The second parameter in the expression above is the time needed for a mechanical scan step ($T_{scanstep}$), the scan step being 12 mm in either the X or Y direction. Depending on the type of scan stage used, this time can vary. Setting this to 0.5 s, corresponding to a speed of 24 mm/s, totaling the time for a single combined measurement and scan step to 1.5 s.

TABLE 1

Total measurement times for different areas when scanning a single magnetic field camera

| Measurement area | # steps | Time per step | Total time |
|---|---|---|---|
| 12 × 24 mm$^2$ | 2 | 1.5 s | 3 s |
| 24 × 24 mm$^2$ | 4 | 1.5 s | 6 s |
| 24 × 48 mm$^2$ | 8 | 1.5 s | 12 s |
| 48 × 48 mm$^2$ | 16 | 1.5 s | 24 s |

For large areas the measurement time becomes relatively long, as is clear from Table 1. This measurement time can be considerably shortened by using a configuration of multiple camera modules, according to any of the embodiments of the present invention.

Some example embodiments are described now.

According to a first example embodiment, the device comprises a 2D array of magnetic field camera modules, for instance mounted on a support S. An example of a regular 2×2 array or matrix of four magnetic camera modules I, II, III, IV (having for instance total measurement area of 48 mm×48 mm) is depicted in FIG. 1. Here the modules are adjacent to each other in a "close stacking", i.e. there are no gaps in between the modules themselves, but his is not necessary. This means that the dead zone 6 in between the detection surfaces of adjacent camera modules equals two times the width of the dead zone 22 of the upper surface of the camera module. This embodiment allows much faster measurement of a large area than the straight forward scan of the large area by a single camera module 1, without losing spatial resolution.

Some advantages of this embodiment are that all camera modules 1 in the 2D array are measured in parallel, decreasing the total measurement time; and that the 'dead measurement zone' 6 between the modules can be filled up with only three mechanical scan steps of the complete configuration of 12 mm (one in X, one in Y and one in X+Y directions), independent of the number of camera modules used and thus of the actual measurement area. To this end, the camera array can for instance be mounted onto a motorized XY(Z) scan stage, or it can be moved manually, or can be moved based on a state of the art movement platform.

Figure 2:
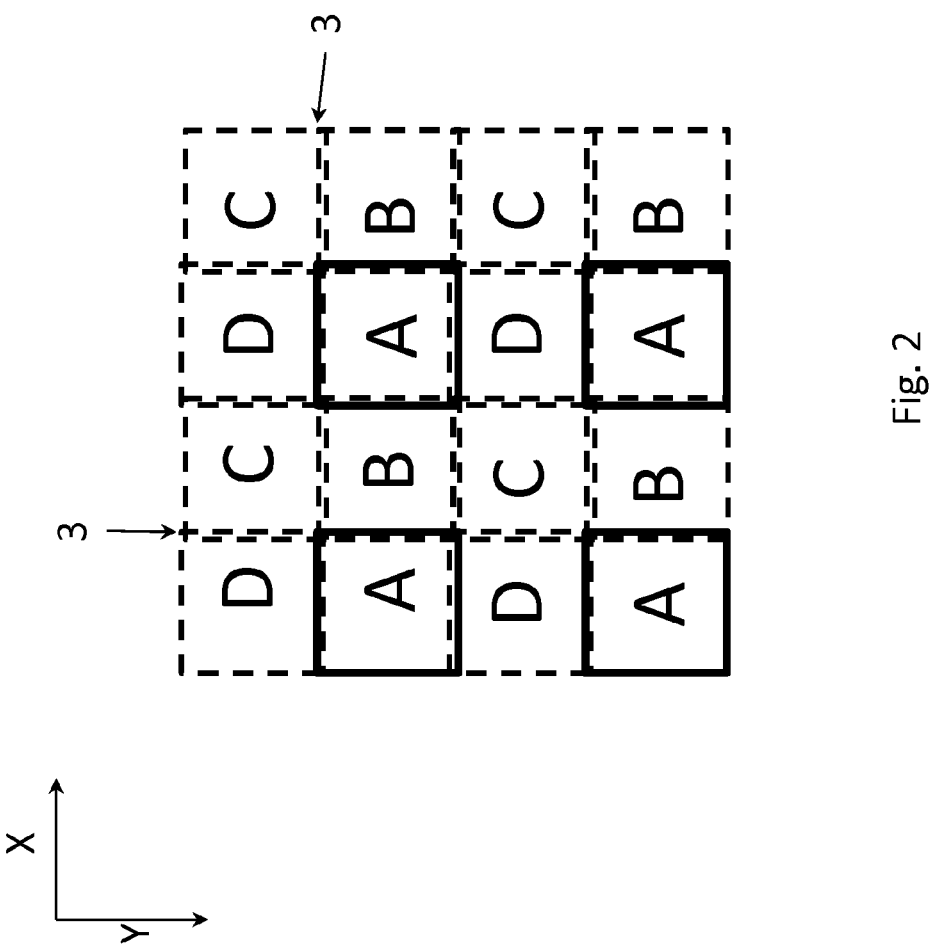
FIG. 2 illustrates an example of operating the arrangement described in relation with FIG. 1.

This principle is illustrated in FIG. 2; the four camera modules first measure the 4 regions marked A. A shift of the whole arrangement is performed in the X direction, after which a measurement of the regions marked B is performed. A small overlap region 3 is foreseen. A further shift of the whole arrangement is performed in the Y direction, after which a measurement of the regions marked C is performed. Again there is a small overlap. A further shift of the whole arrangement is then performed in the X direction (again with a small overlap 3), after which a measurement of the regions marked D is performed and a total surface of about 4×4 detection surface areas is finally completely covered.

The total measurement time in this configuration is $$T_{total}=4\times(T_{single\ measurement}+T_{scanstep}) \quad (2)$$

Note that expression (2) is independent of the measurement area. Although only three mechanical scan steps are required, the returning (fourth) step to the initial position has been included, thereby covering the full measurement period, i.e. after $T_{total}$ a new measurement can immediately be performed.

To show that this configuration allows considerably faster measurement cycles, table 2 gives measurement times for a few measurement area values.

TABLE 2

Total measurement times for different areas using an array of camera modules.

| # camera modules | Measurement area | # steps | Time per step | Total time |
|---|---|---|---|---|
| 1 × 1 | 12 × 24 mm$^2$ | 2 | 1.5 s | 3 s |
| 1 × 1 | 24 × 24 mm$^2$ | 4 | 1.5 s | 6 s |
| 1 × 2 | 24 × 48 mm$^2$ | 4 | 1.5 s | 6 s |
| 2 × 2 | 48 × 48 mm$^2$ | 4 | 1.5 s | 6 s |

From table 2 the following can be concluded:

For areas up to 24 mm×24 mm only one camera module is needed.

For areas larger than 24×24 mm$^2$ (i.e. starting from 24×48 mm$^2$) the measurement time is always 6 seconds, independent of the area.

Adding an additional camera increases the measurement area with 24×24 mm$^2$.

From the above it is clear that for larger areas, significant speed gains are realized by using a camera array configuration, in comparison to scanning a single camera over the area. For example, an area of 48×48 mm$^2$ is scanned 4× faster using a 2×2 camera array (6 seconds) than using one single camera (24 seconds).

Moreover, the measurement speed could for instance be further enhanced by:

Recording less averaging frames

Reducing the spatial resolution per frame

Increasing the mechanical scan speed

For example, a NdFeB motor magnet with a lateral size of 40 mm×20 mm can be measured using a 2×1 array of camera modules (measurement area of 48×24 mm$^2$). For a fast inline measurement cycle, a spatial resolution of 0.2 mm is certainly sufficient. Usually also no averaging is required, given the strong magnetic field produced by the magnet (i.e. large signal/noise ratio). One camera shot hence only takes 0.2 s. When the mechanical scan speed is then also increased to the order of 120 mm/s, the 12 mm step is performed in 0.1 s, bringing the time for one measurement phase down to 0.3 s. The complete area is thus scanned in 4×0.3 s=1.2 seconds.

This time, in the order of 1 second, is compatible with typical measurement times required in inline inspection stations. It becomes therefore a realistic option to e.g. perform a 100% inline quality control of large (motor) magnets.

Note that the resulting time of 1.2 seconds above is independent of the measurement size. I.e. a larger area is measured in exactly the same time by simply adding extra camera modules.

Figure 3:
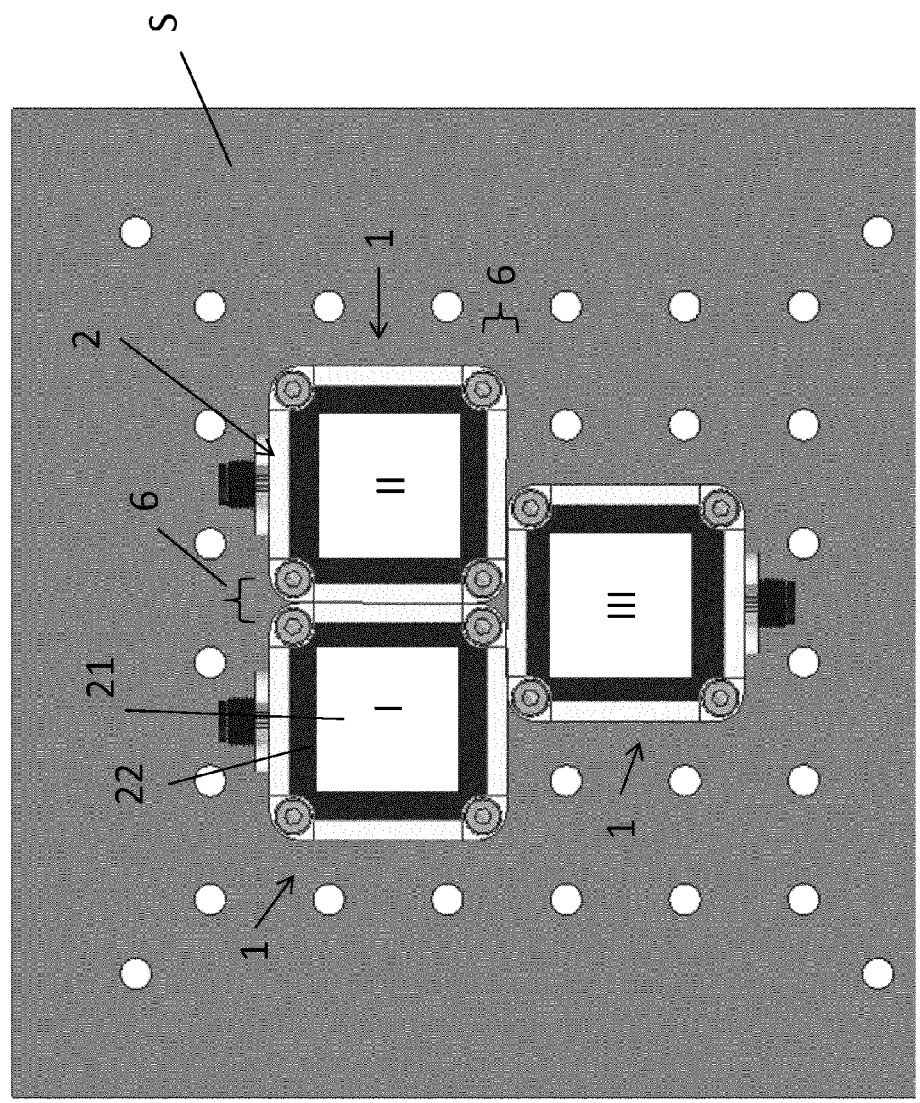
FIG. 3 shows a top view of an arrangement according to a further embodiment of the present invention.
Figure 4:
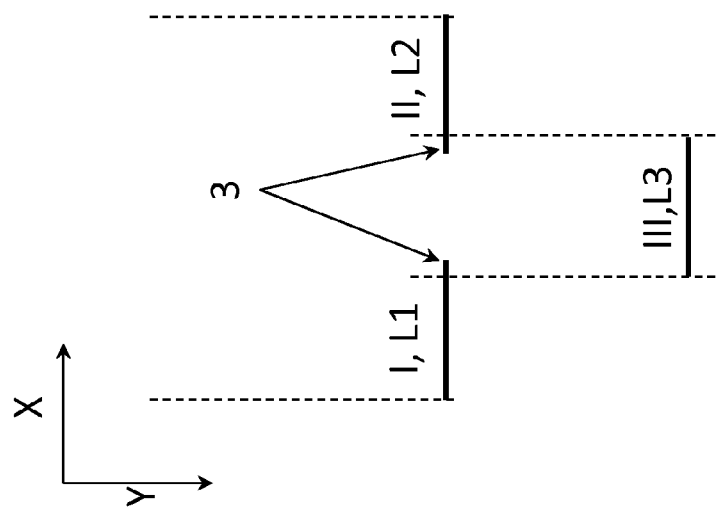
FIG. 4 further illustrates an example of operating the arrangement described in relation with FIG. 3.

According to a second example embodiment, the device is of the line scanning type with '1.5-dimensional' array of magnetic field camera modules I, II, III, as depicted in FIGS. 3 and 4.

The inherent flexibility of the magnetic camera module 1 and the modular approach, allow constructing yet another magnetic field camera configuration, in which one or more camera modules can be used to function as a line scanner. Indeed, the spatial range of the sensor chip of the magnetic camera module 1 can be programmed very flexibly, whereby any sub matrix of the 128×128 sensor pixel matrix can be selected for readout. Some special cases of such sub matrices are:

Any single sensor pixel (a 1×1 matrix)

The full sensor array (128×128)

The full range, but with half (or less) resolution

Any single line in either the X or Y direction

When the sensor array is programmed to only read out a single line, the functionality of a line scanner can be embodied, which can be advantageous in a number of situations.

For example, one can imagine a very long magnet (such as a band magnet for sensor applications), which, in a production line, continuously passes over the magnetic field camera. It is not practical in this case to perform a stepped scanning scheme. Rather it makes sense to continuously read the same line of the magnetic field camera (which covers the complete width of the band magnet) and stitch the lines into one or multiple 2D images for further analysis.

Another application would be in a production line, where individual magnets 5 continuously pass by on a conveyor belt, and where it is not desired to stop the belt for a magnetic field camera measurement. There the magnet could pass over (or under) the magnetic field camera line scanner at a constant speed and this would also generate a 2D image of the magnetic field distribution.

Moreover, such scheme perfectly lends itself for full automation, since no manual magnet manipulation is needed.

In this line scanner configuration, it is clear that there is no practical limit to the length (in the movement direction) of the magnet 5 to be measured. However, the question arises how one can measure a magnet that is wider than the camera's dimension (of 12.8 mm). A solution is shown in FIG. 3.

In this case a 2×1 array provides a line length of 36 mm.

The '1.5 dimensional' solution consists of placing a second row of camera's behind the first row, whereby both rows are shifted half a period (=12 mm) with respect to each other. As can be seen in FIG. 3 and FIG. 4, a magnet 5 approaching the line scanner will first encounter magnetic camera modules I and II, which will each measure a portion of the magnet 5, for instance by using respective lines (e.g. a row or a column of the respective camera module) L1 and L2. The middle part of the magnet is not yet measured due to the dead zone 6 in between modules I and II. As the magnet moves on, however, it will encounter magnetic camera module III which will measure its middle part, for instance by line L3 (e.g. a row or a column of the third camera module), including some overlap region with lines L1 and L2 defined by modules I and II respectively. When the distance in the Y-direction between lines (1 and 2) and line 3 is known, as well as the movement speed of the magnet 5 (more generally the relative movement speed and direction), the magnetic field images recorded by lines L1, L2 and L3 can accurately be stitched together, resulting in a seamless 2D image of the magnetic field distribution with high resolution in both X and Y directions. Moreover, thanks to the overlap regions between neighbouring images, image stitching algorithms can be used to eliminate any errors in e.g. misalignment of the camera modules, deviating Y-distance between the lines or timing inaccuracies between the different cameras.

The measurement speed of this embodiment/configuration can be calculated as follows. Supposing that the desired spatial resolution is equal in X and Y directions. This resolution in turn determines the measurement speed of one line, since it determines the number of sensors that are recorded in the line. The convention was used that the X direction is the direction along a recorded line, whereas the Y direction is the movement direction of the magnet.

For example, a full (0.1 mm) resolution line consists of 128 sensor pixels, that each take about 50 microseconds, giving a total time of 6.4 ms per recorded line in the X direction. In order to obtain the same 0.1 mm resolution in the Y direction, the magnet must have moved 0.1 mm in the Y direction within the 6.4 ms timeframe. This requires a movement speed of about 16 mm/s in the Y direction. The movement speed (and hence measurement speed) can be increased by using a lower spatial resolution. For a half (0.2 mm) resolution image, one line consists of only 64 sensors that need a total time of 3.2 ms to be recorded. In this time, the magnet should move 0.2 mm, resulting in a required movement speed of 64 mm/s, which is four times faster than with full resolution. This figure of 64 mm/s can be used in most applications, since measurements at half spatial resolution are common in practice, and certainly for larger magnets.

It is clear that this '1.5D' configuration is easily scalable, whereby longer lines can be obtained by adding camera modules along the X-direction in both rows, without affecting measurement speed.

Figure 5:
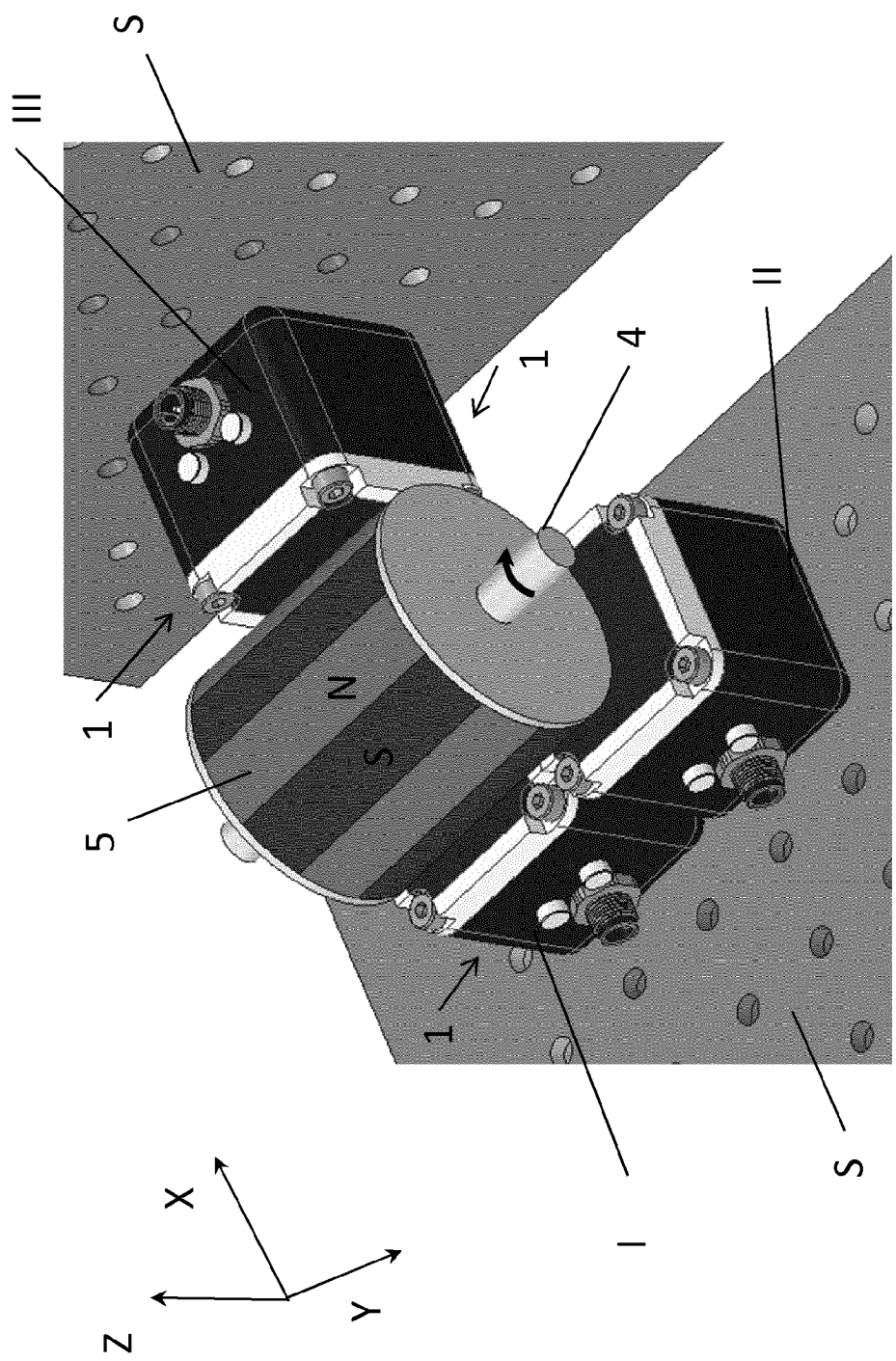
FIG. 5 shows a perspective view of an arrangement according to a further embodiment of the present invention.
Figure 6:
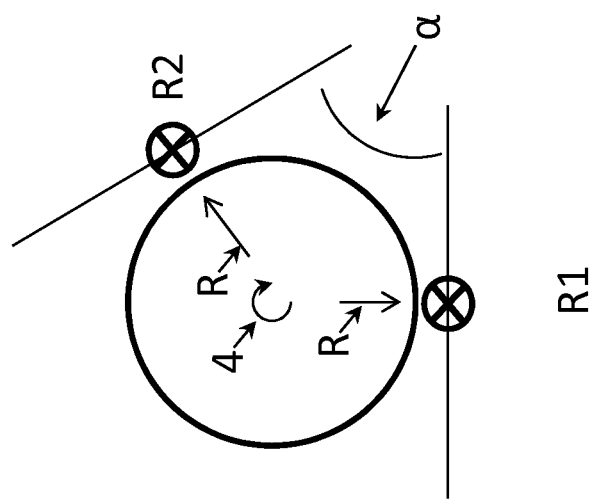
FIG. 6 illustrates an example of operating the arrangement described in relation with FIG. 5, and depicts a side cross-sectional view along the Z-X plane of FIG. 5.

A third example embodiment is described now, in relation with FIGS. 5, 6 and 7. Another application that is often encountered in motor magnet inspection is the inspection of magnets 5 that are mounted on a rotor. In this case it is often desirable to measure the radial component R of the magnetic field over 360° around the rotor and along the full axial length of the rotor. This configuration is also encountered in other magnets or magnet assemblies with cylindrical geometries, such as ring-shaped sensor magnets with radial magnetization.

Although the planar nature of the magnetic field camera's 2D sensor array is fundamentally incompatible with the curved surface of the rotor, the solution here lies again in using the camera in line scan mode as described in the previous section. Indeed, contrary to a plane, a sensor line in the axial direction that has the Hall sensor surface perpendicular to the radial direction does measure the radial component of the field.

Of course a few adaptations must be made with respect to the planar line scanner solution shown in FIGS. 3 and 4.

First, instead of a magnet moving linearly over the magnetic field camera, i.e. the arrangement of a plurality of magnetic field camera modules, the rotor is mounted with its spindle in a rotatable fixture (rotatable around axis 4). The spindle is attached to e.g. a stepper motor which can accurately rotate the rotor over small incremental angles. Secondly, all magnetic field camera modules are preferably perpendicular to the radial direction R of the rotor. For a single row of camera modules R1 this is not a problem. Since there is a 2D array of sensors available on each camera module, there will always be a line that is perfectly radially oriented. This makes the positioning of the rotor also non-critical in the lateral direction (of course the height above the camera module is preferably accurately controlled using the spindle height and parallelism to the camera modules). The second (shifted) row of camera modules R2 however must be taken out of the plane of the first row R1 in order to make the cameras in the second row perpendicular to the radial direction of the rotor. This can be achieved by rotating the second row of camera modules over an angle α, for instance 90°, as shown in 5. In principle, the second row can be placed at other angles, such as 45° or 135° or 180°. In certain embodiments, care must of course be taken to place this shifted row of camera modules R2 at the same measurement distance from the rotor as the first row R1, and to place them parallel to the rotor surface in the axial direction.

A measurement sequence can for instance be performed as follows:
1. The rotor angle is set to its initial position.
2. All camera modules I, II, III record one or more line scans in parallel. Multiple lines can be used for averaging.
3. The rotor is rotated over a predefined step angle.
4. All cameras are read out.
5. Etc. until the full 360° (or other angle) has been measured
6. The images of the different cameras are stitched together in order to obtain a large 2D magnetic field image. In this process, the image recorded by the second row needs to be shifted with a certain angle value relative to the images of the first row, namely the angular offset of both camera module rows (e.g. 90° in the case of FIG. 5).

Alternatively to performing the scanning in steps, the cameras can be read out continuously while the rotor is rotating at a constant speed, which is equivalent to a magnet moving under the line scanner camera arrangement at constant speed.

The measurement speed of the rotor inspection configuration can be expressed in analogy to the linear line scan configuration. Here however, it is not the linear resolution in the Y direction that is relevant, but the desired angular resolution in the direction of the rotor's rotation. One line (at a resolution of 0.2 mm in the axial direction) is recorded in 3.2 ms.

The complete time for a 360° scan is then equal to $$T_{total} = T_{line} * 360°/\alpha_{step} \qquad (3)$$

where
$T_{line}$ is the time for one line (in our case 3.2 ms) and
$\alpha_{step}$ is the angular resolution (in units of degrees).

The required rotation speed of the rotor is then equal to $$\omega_{rotor} = 360°/T_{total} = \alpha_{step}/T_{line}. \qquad (4)$$

For a realistic resolution of e.g. 1°, the following values are obtained:
$T_{total}$=1.2 s
$\omega_{rotor}$312°/s=0.9 rps.

The above results show that a magnetic field image of a full rotor can be recorded in about one second. Again, this time is compatible with inline inspection requirements.

It will be appreciated that a large area magnetic field camera system according to aspects of the present invention, opens up new possibilities for fast and accurate inspection of large magnets, as they are usually found in drive applications, allowing the flexibility to perform automated inline magnet inspection in production lines, automated or manual quality control and R&D for a wide variety of magnetic systems.

The invention claimed is:

1. A device for determining magnetic field, the device comprising:
   two or more independent magnetic field image sensors arranged in a fixed relative position with respect to each other, wherein each magnetic field image sensor measures a magnetic field distribution along a main surface of a magnet; and
   a scanning stage configured to provide a predetermined relative movement between the main surface of the magnet and the two or more independent magnetic field image sensors, thereby scanning the magnetic field distribution along the main surface of the magnet.

2. The device according to claim 1, wherein the two or more independent magnetic field image sensors are arranged such that detection surfaces of each of the two or more independent magnetic field image sensors lie within a single plane.

3. The device according to claim 2, wherein the detection surfaces of each of the two or more independent magnetic field image sensors are arranged and aligned along a single line.

4. The device according to claim 2, wherein the detection surfaces of each of the two or more independent magnetic field image sensors are arranged and aligned along two parallel lines, such that an orthogonal projection of the detection surfaces on a virtual line parallel to the two parallel lines provides a single, uninterrupted portion of the virtual line.

5. The device according to claim 3,
wherein the scanning stage is configured to provide one or more relative translational movements between the two or more independent magnetic field image sensors and the main surface of the magnet, and
wherein the detection surfaces and the main surface of the magnet are maintained parallel during the one or more relative translational movements.

6. The device according to claim 5, wherein at least one of the one or more relative translational movements between the two or more independent magnetic field image sensors and the main surface of the magnet bridges a previously existing dead zone between at least two predetermined detection surfaces.

7. The device according to claim 3, wherein the scanning stage is configured to provide a relative rotational movement between the two or more independent magnetic field image sensors or the main surface of the magnet around a rotation axis.

8. The device according to claim 1,
wherein a first subset of the two or more independent magnetic field image sensors is arranged such that their detection surfaces lie within a first plane, and
wherein a disjoint second subset of the two or more independent magnetic field image sensors is arranged such that their detection surfaces lie within a second plane, and
wherein the second plane is different from the first plane.

9. The device according to claim 8,
wherein the detection surfaces of the first subset are arranged and aligned along a first line,
wherein the detection surfaces of the second subset are arranged and aligned along a second line, and
wherein the first line and the second line are parallel.

10. The device according to claim 9, wherein the first plane and the second plane are parallel.

11. The device according to claim 9, wherein the first plane and the second plane form an angle different from 0° or 180°.

12. The device according to claim 9, wherein an orthogonal projection of the detection surfaces of the first subset and the detection surfaces of the second subset on a virtual line parallel to the first line and the second line covers a single, uninterrupted portion of the virtual line.

13. The device according to claim 8, wherein the scanning stage is configured to provide a relative rotational movement between the two or more independent magnetic field image sensors or the main surface of the magnet around a rotation axis.

14. The device according to claim 8, wherein the first plane and the second plane are arranged such that, when the scanning stage provides the predetermined relative movement between the main surface of the magnet and the two or more independent magnetic field image sensors, at least a portion of the main surface of the magnet is scanned by a magnetic field image sensor of the first subset and by a magnetic field image sensor of the second subset at different distances from the main surface of the magnet.

15. A method for determining magnetic field, the method comprising:
providing a magnet;
providing two or more independent magnetic field image sensors arranged in a fixed relative position with respect to each other, wherein each magnetic field image sensor measures a magnetic field distribution along a main surface of the magnet; and
providing a predetermined relative movement between the main surface of the magnet and the two or more independent magnetic field image sensors, thereby scanning the magnetic field distribution along the main surface of the magnet.

16. The device according to claim 1, wherein the magnet is a permanent magnet.

17. The device according to claim 1, wherein the predetermined relative movement is of a distance smaller a size of any of the two or more independent magnetic field image sensors, thereby providing an overlap region between images recorded by each of the two or more independent magnetic field image sensors.

18. The device according to claim 1, wherein the magnet is mounted on a rotor.

19. The device according to claim 18, wherein measuring the magnetic field distribution along the main surface of the magnet comprises measuring a radial component of the magnetic field distribution over 360° around the rotor and along a full axial length of the rotor.

20. The device according to claim 19, wherein at least one of the two or more independent magnetic field image sensors comprises a Hall sensor surface, perpendicular to a radial direction of the rotor, that measures the radial component of the magnetic field distribution.

* * * * *